(12) United States Patent
Lu

(10) Patent No.: US 6,479,341 B1
(45) Date of Patent: Nov. 12, 2002

(54) CAPACITOR OVER METAL DRAM STRUCTURE

(75) Inventor: Chih-Yuan Lu, Hsinchu (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/033,102

(22) Filed: Mar. 2, 1998

(51) Int. Cl.⁷ .......................................... H01L 21/8242
(52) U.S. Cl. ........................ 438/239; 438/240; 438/241; 438/253; 438/256; 438/396; 438/399
(58) Field of Search .................... 438/239, 240, 438/241, 253, 256, 396, 399

(56) References Cited

U.S. PATENT DOCUMENTS

| | | | |
|---|---|---|---|
| 5,447,882 A | | 9/1995 | Kim ............................. 437/60 |
| 5,620,917 A | | 4/1997 | Yoon et al. .................. 438/253 |
| 5,622,883 A | | 4/1997 | Kim ............................. 438/396 |
| 5,716,881 A | * | 2/1998 | Liang et al. ................. 438/238 |
| 5,780,339 A | * | 7/1998 | Lin et al. ..................... 438/253 |
| 5,879,986 A | * | 3/1999 | Sung ............................ 438/253 |
| 6,153,510 A | * | 11/2000 | Ishibashi .................... 438/396 |
| 6,165,804 A | * | 12/2000 | Fazan et al. ................. 438/396 |

* cited by examiner

Primary Examiner—Richard Booth
Assistant Examiner—Lynne A. Gurley
(74) Attorney, Agent, or Firm—George O. Saile; Stephen B. Ackerman (57) ABSTRACT

A method of creating a Capacitor Over Metal, (COM), stacked capacitor structure, for a DRAM device, has been developed. The process features creating metal interconnect structures, prior to the creation of the COM, stacked capacitor structure. The metal structures are connected to underlying regions of the semiconductor substrate via polysilicon contact plugs, and metal studs, while the same metal structures are connected to overlying structures, such as the COM stacked capacitor structure, via additional metal studs. Planarization of passivating insulator layers, result in topology reductions, reducing the severity of opening via holes to specific metal structures.

29 Claims, 8 Drawing Sheets

CAPACITOR OVER METAL DRAM STRUCTURE

BACKGROUND OF THE INVENTION

(1) Field of the Invention

The present invention relates to a fabrication method used to create a stacked capacitor structure, for a DRAM device, in which the stacked capacitor structure is created after formation of DRAM interconnect metal structures.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, and thus limiting the amount of area the overlying STC structure can occupy, without interfering with neighboring cells.

Solutions to the shrinking design area, assigned to STC structures, have been addressed via novel semiconductor fabrication processes which result in an increase in surface area for only the lower, or storage electrode, of the STC structure, while maintaining the area original design area of the STC structure. One method for achieving this objective has been accomplished by creating lower electrodes with pillars, or protruding shapes of polysilicon, thus resulting in a greater electrode surface area then would have been achieved with conventional flat surfaces. Kim, in U.S. Pat. No. 5,447,882, describes such an STC structure, comprised of a lower electrode, formed by creating protruding polysilicon features, via patterning of a polysilicon layer, however the topography created with these novel STC configurations present difficulties for subsequent formation of overlying interconnect metal structures. For example thick insulator layers are needed for adequate coverage of the STC structure, which presents additional problems when opening vias in the thick insulator layer, and then attempting to fill the high aspect ratio via holes with metal. Thus the capacitor under bit line, (CUM), structure, can result in yield and reliability problems resulting from poor metal coverage, in high aspect ratio holes.

This invention will describe a process, and a structure, in which the capacitor structure is constructed after formation of the metal interconnect levels. After passivation of underlying metal interconnect structures with insulator layers, and planarization of the insulator layer, the stacked capacitor structure is formed over the passivated metal structures, (Capacitor Over Metal—COM), thus avoiding formation of metal interconnects over severe topologies created from an underlying STC structure.

SUMMARY OF THE INVENTION

It is an object of this invention to create a DRAM device, with an STC structure, in which the surface area of the lower electrode, of the STC structure is increased, without creating the high aspect ratios of metal via holes encountered using conventional capacitor under metal, (CUM), stacked capacitor structures.

It is another object of this invention to form the STC structure after the formation of metal interconnect structures, on a planarized, smooth top surface of an insulator layer, used on the underlying metal interconnect structures.

In accordance with the present invention a method for fabricating a DRAM device, with an STC structure that is formed after the formation of metal interconnect structures, has been developed. A transfer gate transistor comprised of: a thin gate insulator; a polysilicon gate structure; lightly doped source and drain regions; insulator spacers on the sidewalls of the polysilicon gate structure; and/or heavily doped source and drain regions; is formed on a semiconductor substrate. Polysilicon plugs are formed in a first insulator layer, contacting a source and drain region between polysilicon gate structures. A second insulator layer is deposited, followed by the formation of shallow, first level metal studs, located in shallow via holes that had been created in the second insulator layer, with the shallow, first level metal studs contacting the polysilicon plugs. A deep via hole, however shallower than via holes used in conventional CUM DRAM structures, is also formed in the second, and in the first insulator layers, allowing a deep, first level metal stud to be created, with the deep, first level metal stud contacting a region of the semiconductor substrate, exposed in the deep via hole. Metal structures are next formed, and used for: a bit line structure contacting a first, shallow, first level metal stud; a first level metal interconnect structure, contacting the deep, first level metal stud; and for a metal plug, contacting a second, shallow, first metal stud. A third insulator layer is deposited, and planarized, followed by the opening of a via hole, exposing the top surface of the first level metal interconnect structure. A second level metal stud is next formed in the via hole in the third insulator layer. A second level interconnect structure is next formed, contacting a second level metal stud, which in turn overlays and contacts a first level metal interconnect structure. A fourth insulator layer is deposited followed by creation of a third level metal stud. A stacked capacitor structure is finally formed on the fourth insulator layer, contacting the third level metal stud, in a region in which the third level metal stud overlays the metal plug, allowing contact between the STC structure and a source and drain region, of the transfer gate transistor. The capacitor structure, and process used for formation, described in this invention is shown overlaying only two levels of metal interconnect structures, however this invention can be applied to overlay as many metal interconnect levels as desired.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, featuring a COM, stacked capacitor structure, will now be described in detail. The transfer gate transistor, used for this DRAM device, in this invention, will be an N channel device. However the COM, stacked capacitor structure, described in this invention, can also be applied to P channel, transfer gate transistor.

Figure 1:
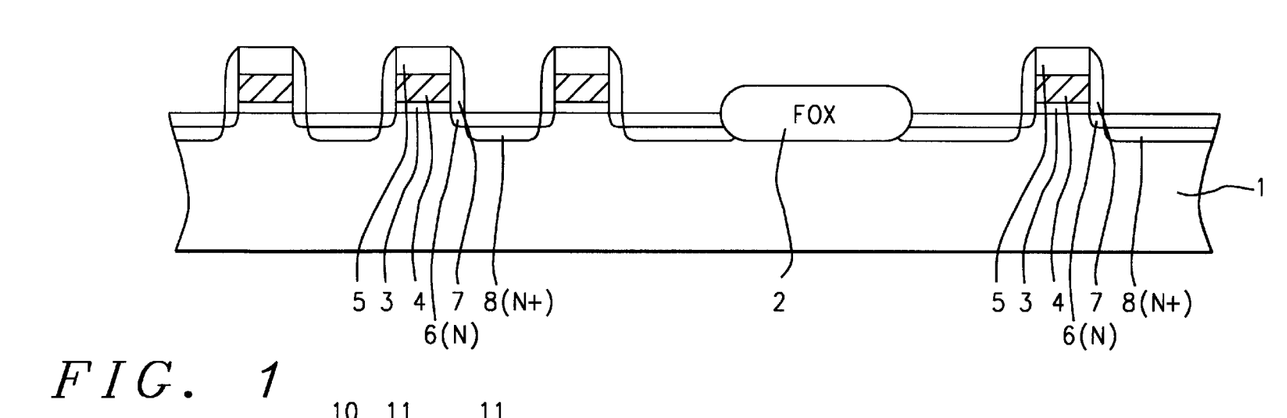
FIGS. 1–9, which schematically show, in cross-sectional style, the key fabrication stages used in the creation of a DRAM device, with a Capacitor Over Metal, (COM), STC structure, formed after the formation of metal interconnect structures.

Referring to FIG. 1, a P type, semiconductor substrate 1, with a <100>, single crystalline orientation,is used. Field oxide (FOX), region 2, is used for purposes of isolation. Briefly the FOX region 2, is formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX region 2, from growing on areas of substrate, 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. A shallow trench isolation, (STI), process can also be used to create the desired isolation regions provided by FOX regions 2. After a series of wet cleans, a gate insulator layer 3, of silicon oxide is thermally grown in an oxygen-steam ambient, at a temperature between about 750 to 1050° C., to a thickness between about 50 to 200 Angstroms. A first polysilicon layer 4, is next deposited using low pressure chemical vapor deposition, (LPCVD), procedures, at a temperature between about 500 to 700° C., to a thickness between about 1000 to 4000 Angstroms. Polysilicon layer 4, can either be grown intrinsically and doped via ion implantation of arsenic or phosphorous, at an energy between about 30 to 80 KeV, at a dose between about 1E113 to 1E16 atoms/cm$^2$, or grown using in situ doping procedures, via the incorporation of either arsine or phosphine to the silane ambient. A silicon nitride layer 5, is next deposited via LPCVD or plasma enhanced chemical vapor deposition, (PECVD), procedures, to a thickness between about 1000 to 3000 Angstroms. Conventional photolithographic and reactive ion etching, (RIE), procedures, using either $CF_4$—$O_2$—$H_2$, $C_2F_6$, or $CHF_3$, as an etchant for silicon nitride layer 5, and using $Cl_2$, or other chlorine based gases, as an etchant for polysilicon layer 4, are used to create polycide gate structures comprised of silicon nitride layer 5, and polysilicon layer 4, shown schematically in FIG. 1. Photoresist removal is accomplished via plasma oxygen ashing and careful wet cleans.

A lightly doped source and drain region 6, is next formed via ion implantation of phosphorous, at an energy between about 20 to 50 KeV, at a dose between about 1E13 to 1E14 atoms/cm$^2$. A silicon nitride is then deposited using either LPCVD or PECVD procedures, at a temperature between about 400 to 700° C., to a thickness between about 500 to 2000 Angstroms, followed by an anisotropic RIE procedure, using either $CF_4$—$O_2H_2$, $C_2F_6$, or $CHF_3$, as an etchant, creating silicon nitride insulator spacers 7, on the sides of the polycide gate structures. A heavily doped source and drain region 8, is then formed via ion implantation of arsenic, at an energy between about 30 to 80 KeV, at a dose between about 1E15 to 1E16 atoms/cm$^2$. Heavily doped source and drain region 8, is an optional. The DRAM structure in this invention can be formed using only lightly doped source and drain region 6. The result of these procedures are schematically shown in FIG. 1.

Figure 2:
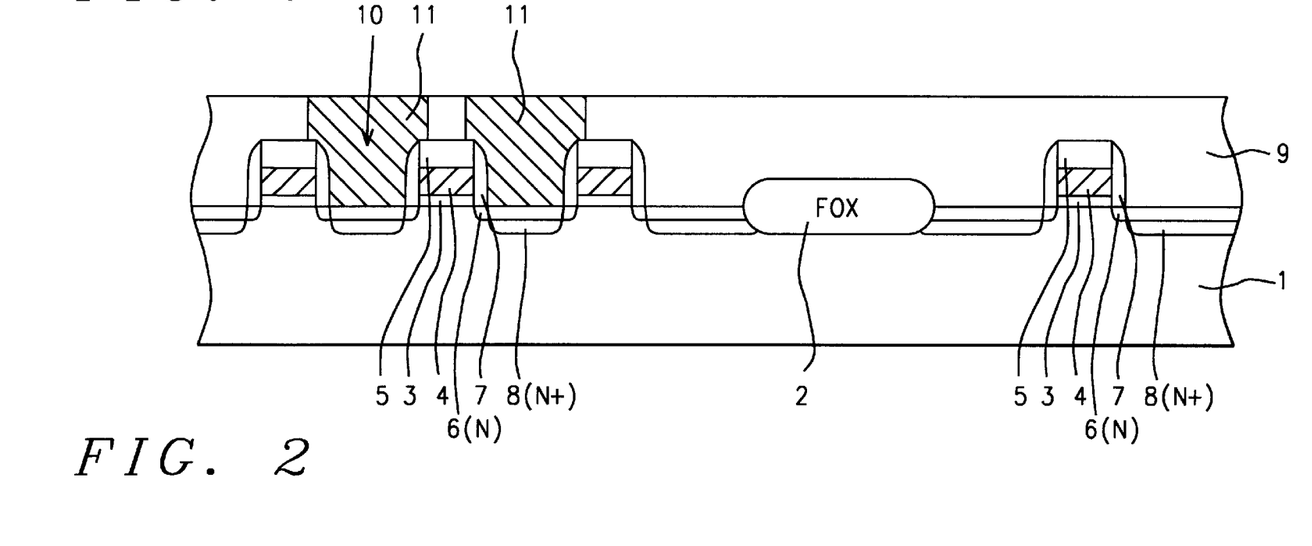

A first insulator layer of silicon oxide 9, is next deposited using LPCVD or PECVD procedures, at a temperature between about 200 to 600° C., to a thickness between about 3000 to 8000 Angstroms, followed by a planarization procedure, using a chemical mechanical polishing, (CMP), procedure, used to create a smooth top surface for insulator layer 9. Conventional photolithographic and RIE procedures, using $CHF_3$ as an etchant, are used to open self-aligned contact, (SAC), holes 10, in silicon oxide layer 9, exposing the top surface of heavily doped source and drain region 8, between the silicon nitride encapsulated, polycide gate structures. Photoresist removal is performed via use of plasma oxygen ashing and careful wet cleans. Conductive polysilicon contact plugs 11, schematically shown in FIG. 2, are next formed. Polysilicon contact plugs 11, are formed via deposition of a polysilicon layer, via LPCVD procedures, at a thickness between about 500 to 3000 Angstroms, doped during an in situ doping, deposition procedure, or grown intrinsically and doped via an arsenic, or a phosphorous, ion implantation procedure, followed by a patterning procedure, via anisotropic RIE procedures, using $Cl_2$ as an etchant, or via a CMP procedure. The conductive plugs can also be formed from tungsten, tungsten silicide, or other refractory metals, or metal suicides.

Figure 3:
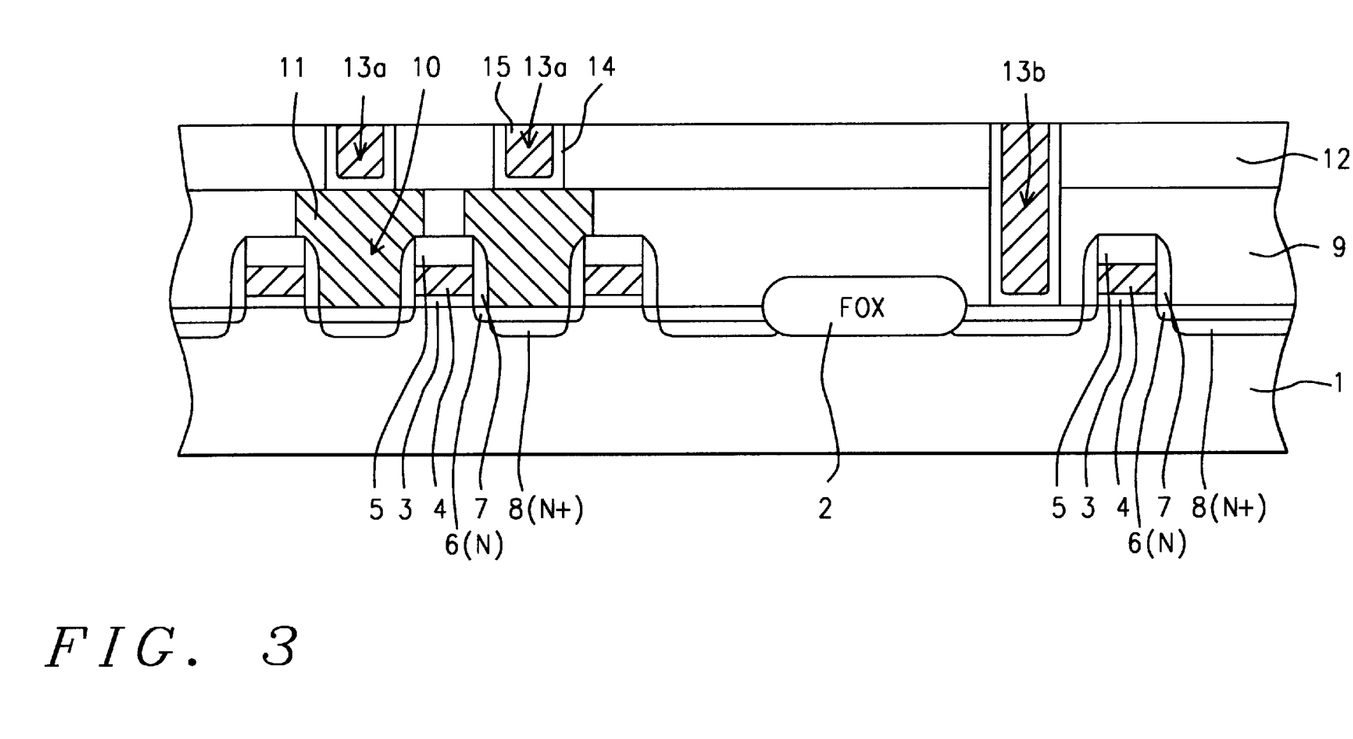

A second insulator layer of silicon oxide 12, is next deposited using either LPCVD or PECVD procedures, at a temperature between about 200 to 600° C., to a thickness between about 2500 to 7500 Angstroms. Insulator layer 12, can also be a BPSG or PSG layer, obtained via addition of either $PH_3$ and $B_2H_6$, or just $PH_3$, to a TEOS, (tetraethylorthosilicate), ambient. Photolithographic and RIE procedure, using $CHF_3$ as an etchant for second insulator layer 12, are used to create shallow via holes 13$a$, exposing the top surface of polysilicon contact plugs 11. The RIE procedure is then extended to create deep via hole 13$b$, in second insulator layer 12, and in first insulator layer 9, exposing a heavily doped region, in semiconductor substrate 1. This is schematically shown in FIG. 3. After removal of the photoresist shape used as a mask for via hole formation, a deposition of a titanium—titanium nitride, (Ti—TiN), layer 14, is next made, via R.F. sputtering, or via a CVD procedure, to a thickness between about 200 to 800 Angstroms for titanium, and between about 500 to 1500 Angstroms for titanium nitride. This is followed by the deposition of a tungsten layer 15, obtained via LPCVD or R.F. sputtering procedures, to a thickness between about 600 to 2500 Angstroms, completely filling shallow via holes 13$a$, and deep via hole 13$b$. Unwanted regions of Ti—TiN layer 14, and tungsten layer 15, are removed using either a CMP procedure, or an anisotropic RIE procedure, using $Cl_2$ as an etchant, creating the first level metal studs, comprised of tungsten layer 15, and underlying Ti—TiN layer 14, contacting polysilicon contact studs, in shallow via holes 13a, and contacting a heavily doped source and drain region, in deep via hole 13b, shown schematically in FIG. 3.

Figure 4:
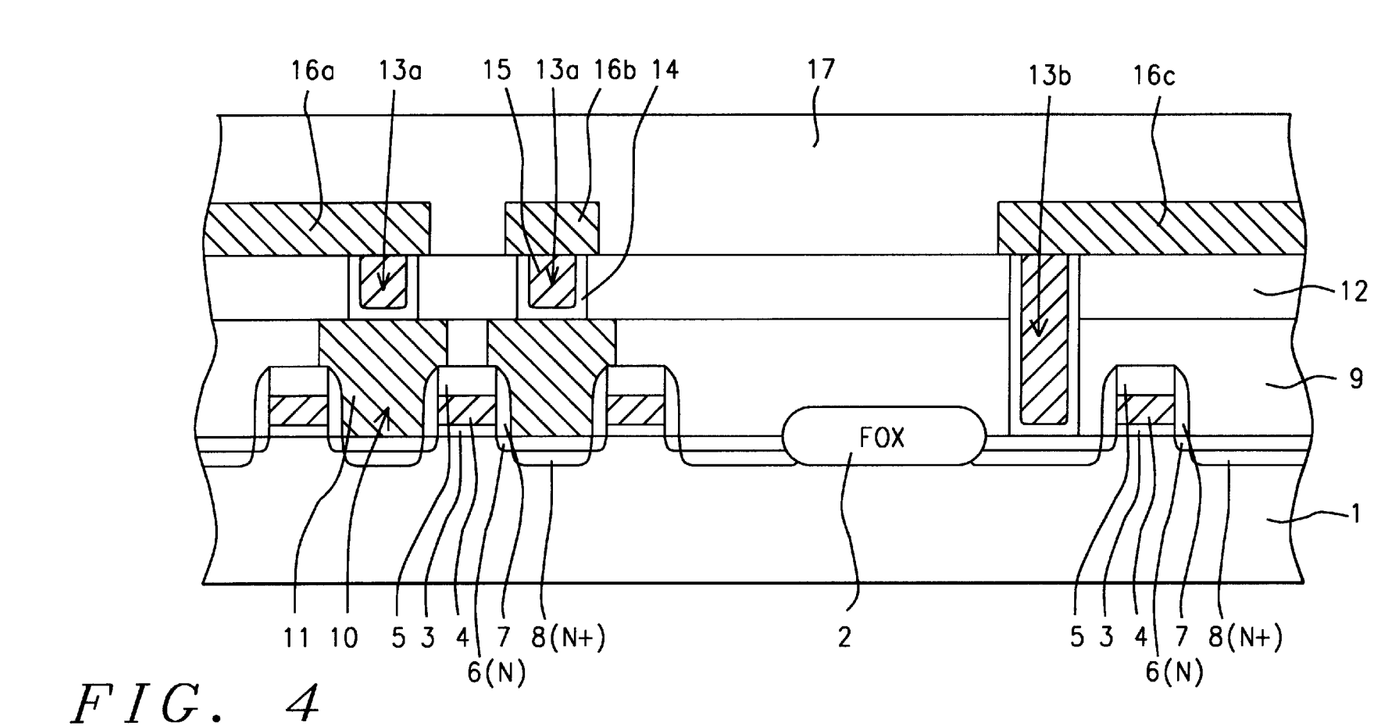

A metal layer of aluminum, containing between about 0 to 2% copper, is deposited using R.F. sputtering procedures, to a thickness between about 1500 to 6000 Angstroms. Photolithographic and RIE procedures, using $Cl_2$ as an etchant, are then employed to create first level metal structures: 16a, to be used as a bit line structure, contacting one of the first level metal studs 13a; 16b, to be used as metal plug, contacting the other first level metal stud 13a; and 16c, to be used as a first level metal interconnect structure, contacting first level metal stud 13b. The first level metal structures can also be formed from an LPCVD tungsten layer. After removal of the masking photoresist layer, via plasma oxygen ashing and careful wet cleans, a third insulator layer 17, of silicon oxide is deposited using a PECVD procedures, at a temperature between about 200 to 600° C., to a thickness between about 3000 to 8000 Angstroms, followed by a CMP procedure, used to planarize the top surface of third insulator layer 17. The result of these procedures are schematically shown in FIG. 4.

Figure 5:
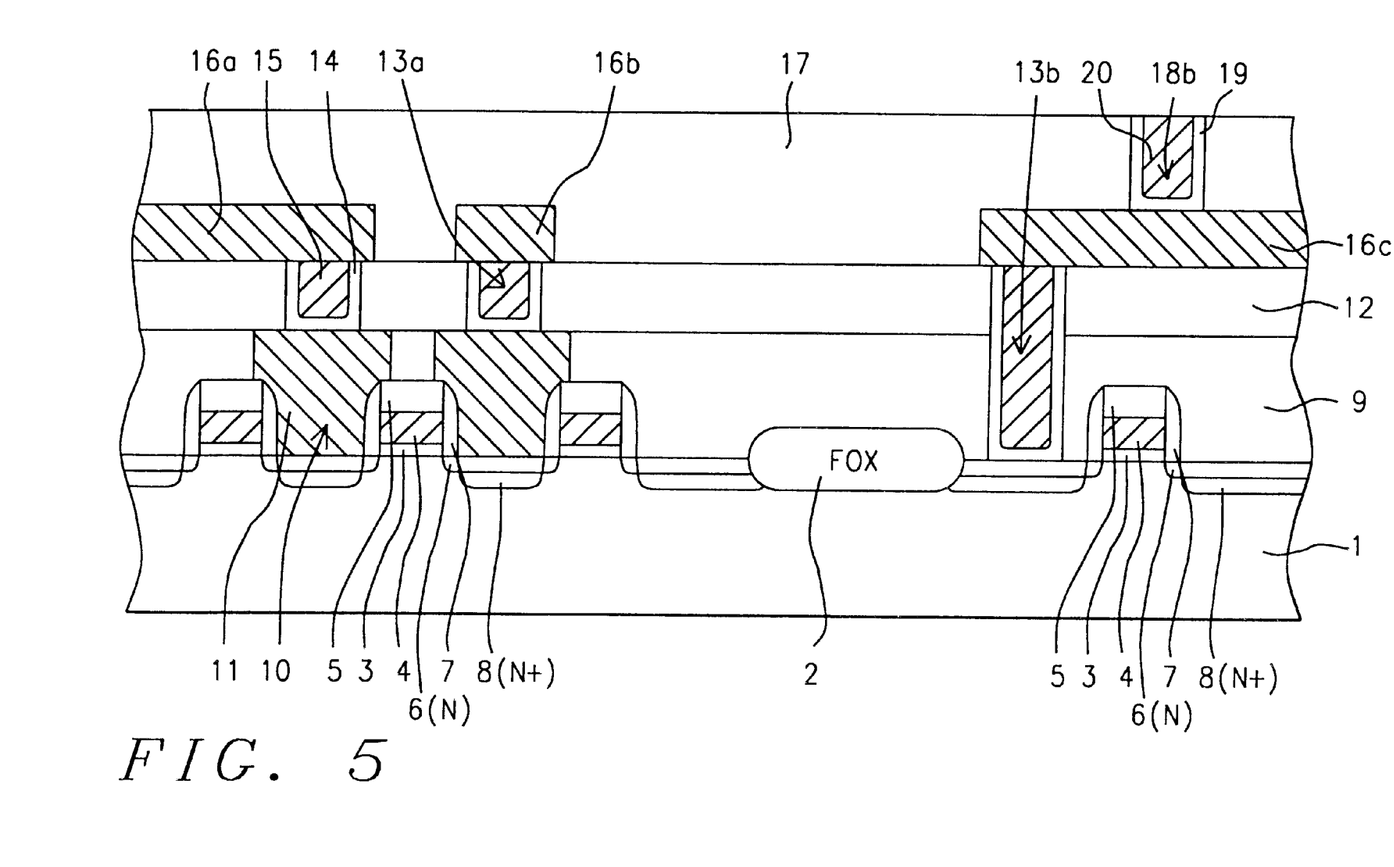

Photolithographic and RIE procedures, using $CHF_3$ as an etchant, are used to create via hole 18b, in third insulator layer 17, with via hole 18b, exposing the top surface of first level metal interconnect structure 16c. After removal of photoresist via plasma oxygen ashing and careful wet cleans, second level metal stud 20, are formed in via hole 18b, shown schematically in FIG. 5. Second level metal stud 20, is formed via deposition of a TiN layer 19, via an R.F. sputtering, or a CVD procedure, at a thickness between about 500 to 1500 Angstroms, and by a deposition of a tungsten layer 20, using either LPCVD or R.F. sputtering procedures, to a thickness between about 3000 to 8000 Angstroms. Unwanted regions of these layers are removed using either CMP, or a selective, anisotropic RIE procedure, using $Cl_2$ as an etchant, resulting in the second level metal stud 20, residing via hole 18b.

Figure 6:
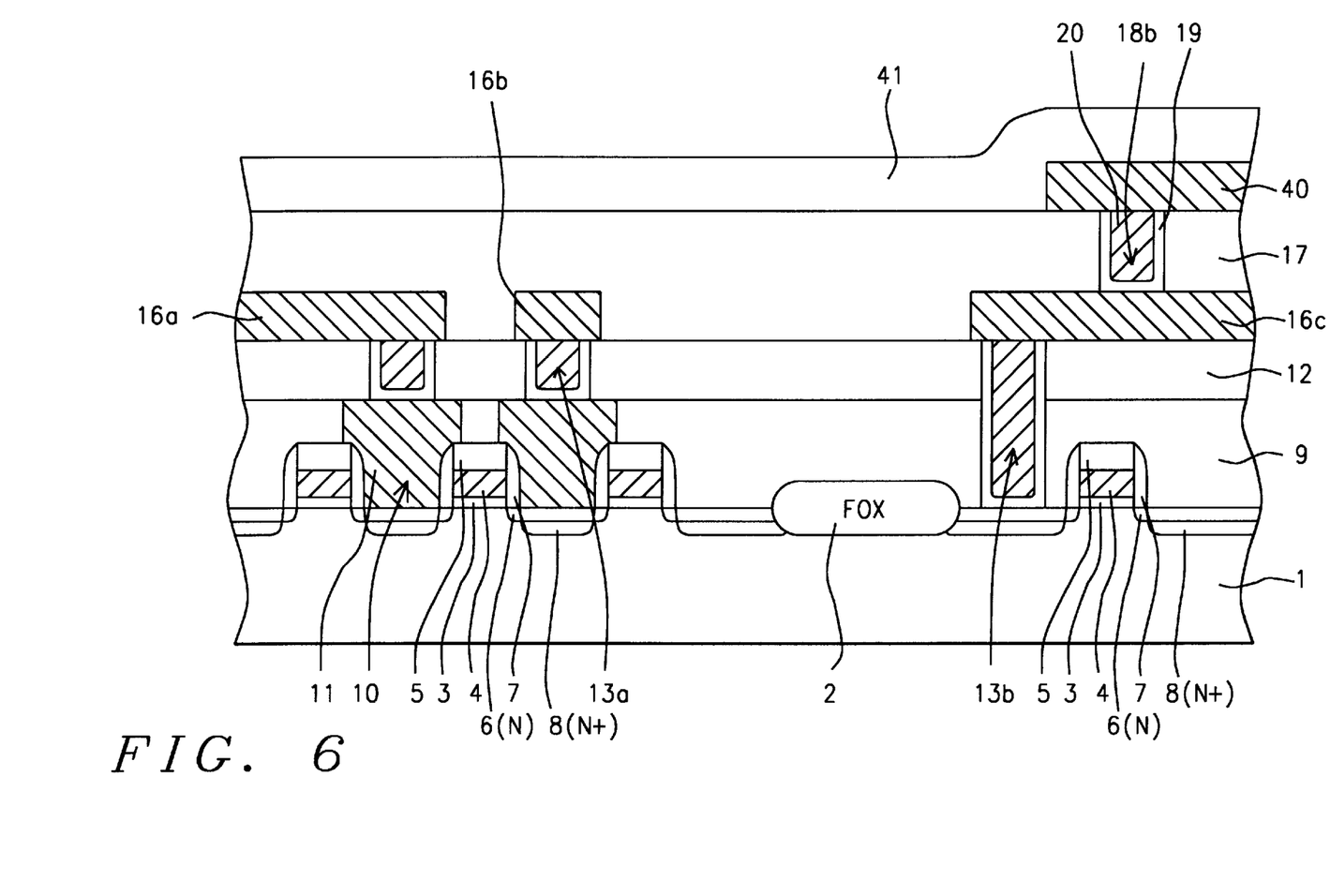

A second level metal interconnect structure 40, is next formed, and schematically shown in FIG. 6. A deposition of an aluminum based metallization layer, via R.F. sputtering, is followed by photolithographic and anisotropic RIE procedures, using $Cl_2$ as an etchant for the aluminum based metallization layer, creating second level metal interconnect structure 40. After removal of the photoresist shape, used as a mask for patterning of second level metal interconnect structure 40, via plasma oxygen ashing and careful wet cleans, a fourth insulator layer 41, is deposited. Fourth insulator layer, schematically shown in FIG. 6, is a composite layer comprised of a silicon oxide layer, capped with an overlying silicon nitride layer, deposited using PECVD procedures. The overlying silicon nitride layer, of composite fourth insulator layer 41, is between about 500 to 1500 Angstroms in thickness.

Figure 7:
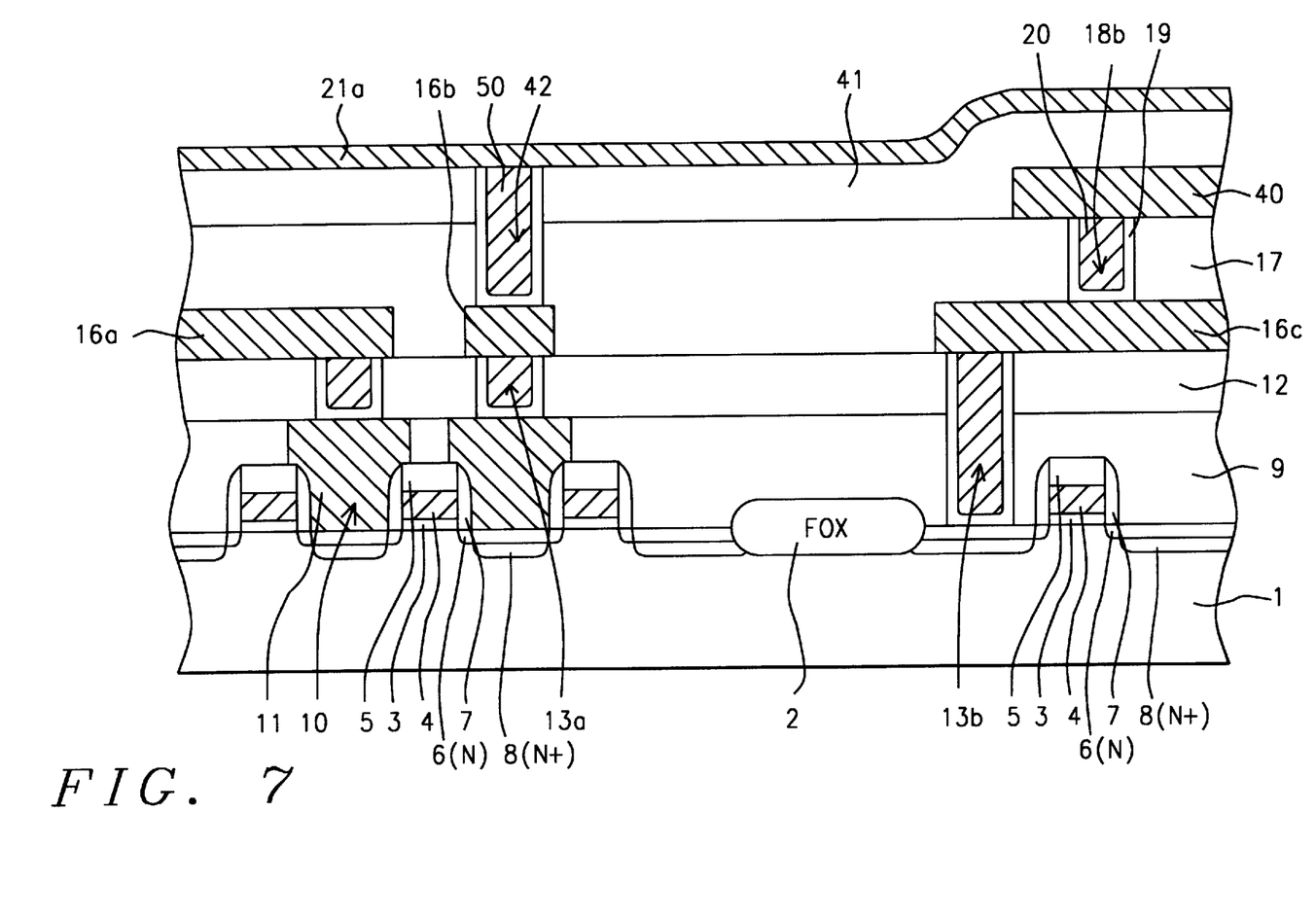

Via hole 42, is next formed in fourth insulator layer 41, and in third insulator 17, via photolithographic and anisotropic RIE procedures, using either $CF_4$—$O_2$—$H_2$, $C_2F_6$, or $CHF_3$ as an etchant for silicon nitride, while using $CHF_3$ as an etchant for silicon oxide, exposing the top surface of metal plug 16b. After removal of the masking photoresist layer, via plasma oxygen ashing and careful wet cleans, a third level metal stud 50, is formed in via hole 42, and shown schematically in FIG. 7. Third level metal stud 50, is comprised of a TiN barrier layer, and a tungsten fill. The TiN barrier layer is deposited using R.F. sputtering, or CVD procedures, while the tungsten fill layer is also obtained via R.F. sputtering or LPCVD procedures. Unwanted regions of TiN and tungsten, overlaying the top surface of fourth insulator layer 41, are removed using CMP procedures, creating third level metal stud 50, in via hole 42. A polysilicon layer 21a, is next deposited via an LPCVD procedure, to a thickness between about 250 to 2000 Angstroms. Polysilicon layer 21a can be doped during an in situ doping deposition procedure, or grown intrinsically and doped via an arsenic or phosphorous ion implantation procedure. This is schematically shown in FIG. 7.

Figure 8:
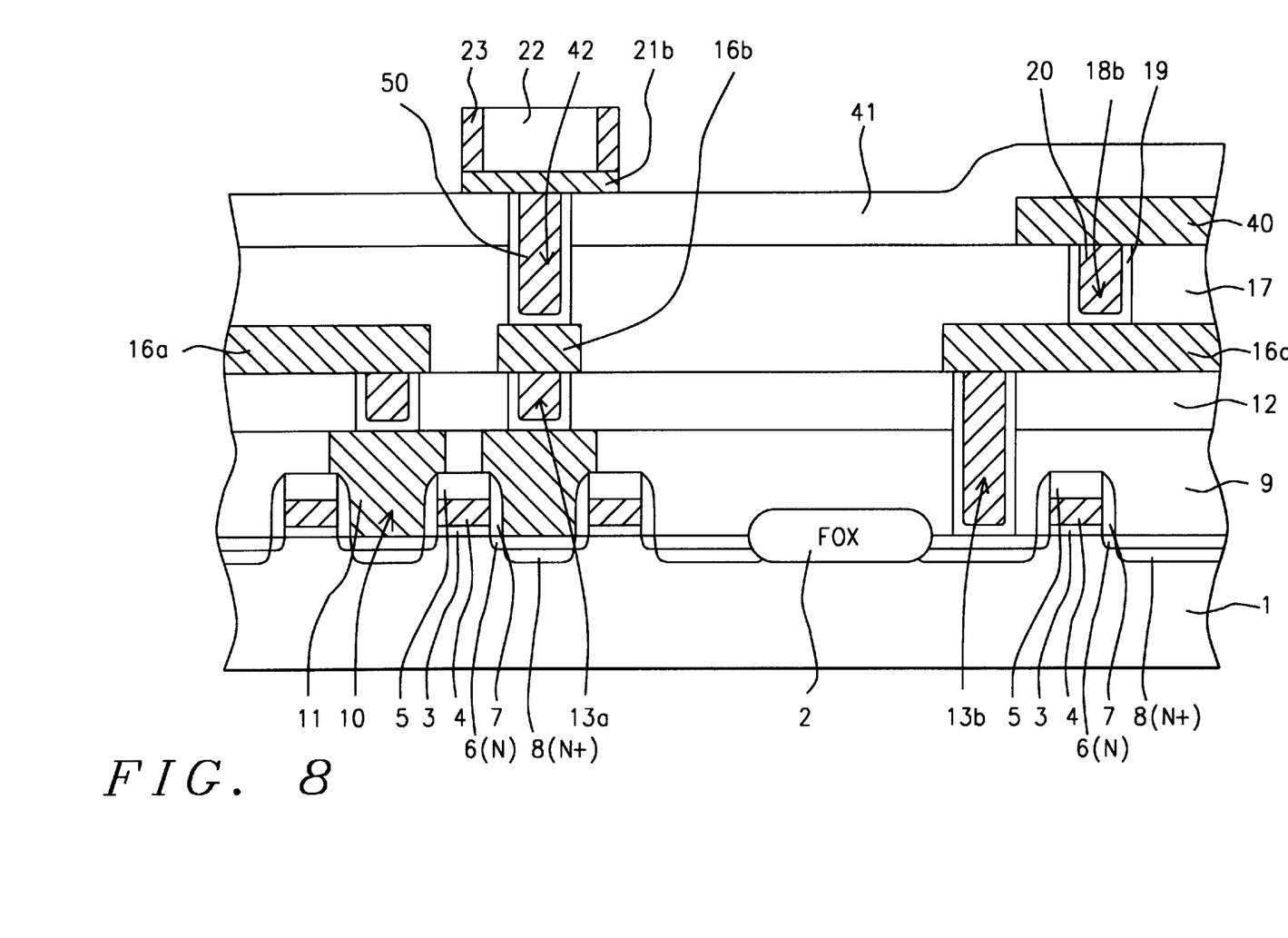

An insulator layer is next deposited using LPCVD or PECVD procedures, to a thickness between about 2000 to 12000 Angstroms, and then patterned via photolithographic and anisotropic RIE procedures, using $CHF_3$ procedures, to create insulator shape 22, shown schematically in FIG. 8. The thickness of the insulator layer, used for insulator shape 22, will influence the amount of surface area for the subsequent stacked capacitor structure. Another polysilicon layer is next deposited, again via an LPCVD procedure, to a thickness between about 2000 to 3000 Angstroms. A selective, anisotropic RIE procedure, using $Cl_2$ as an etchant, is used to create polysilicon spacer 23, on the sides of insulator shape 22, while removing regions of polysilicon layer 21a, not covered by insulator shape 22, resulting in a lower electrode, or storage node structure, comprised of polysilicon spacers 23, connected to a horizontal, polysilicon shape 21b, lying on the smooth top surface of fourth insulator layer 41, and with polysilicon shape 21b, contacting third level metal stud 50. The height of polysilicon spacers 23, is the thickness of insulator shape 22, between about 2000 to 12000 Angstroms. This is schematically shown in FIG. 8.

Figure 9:
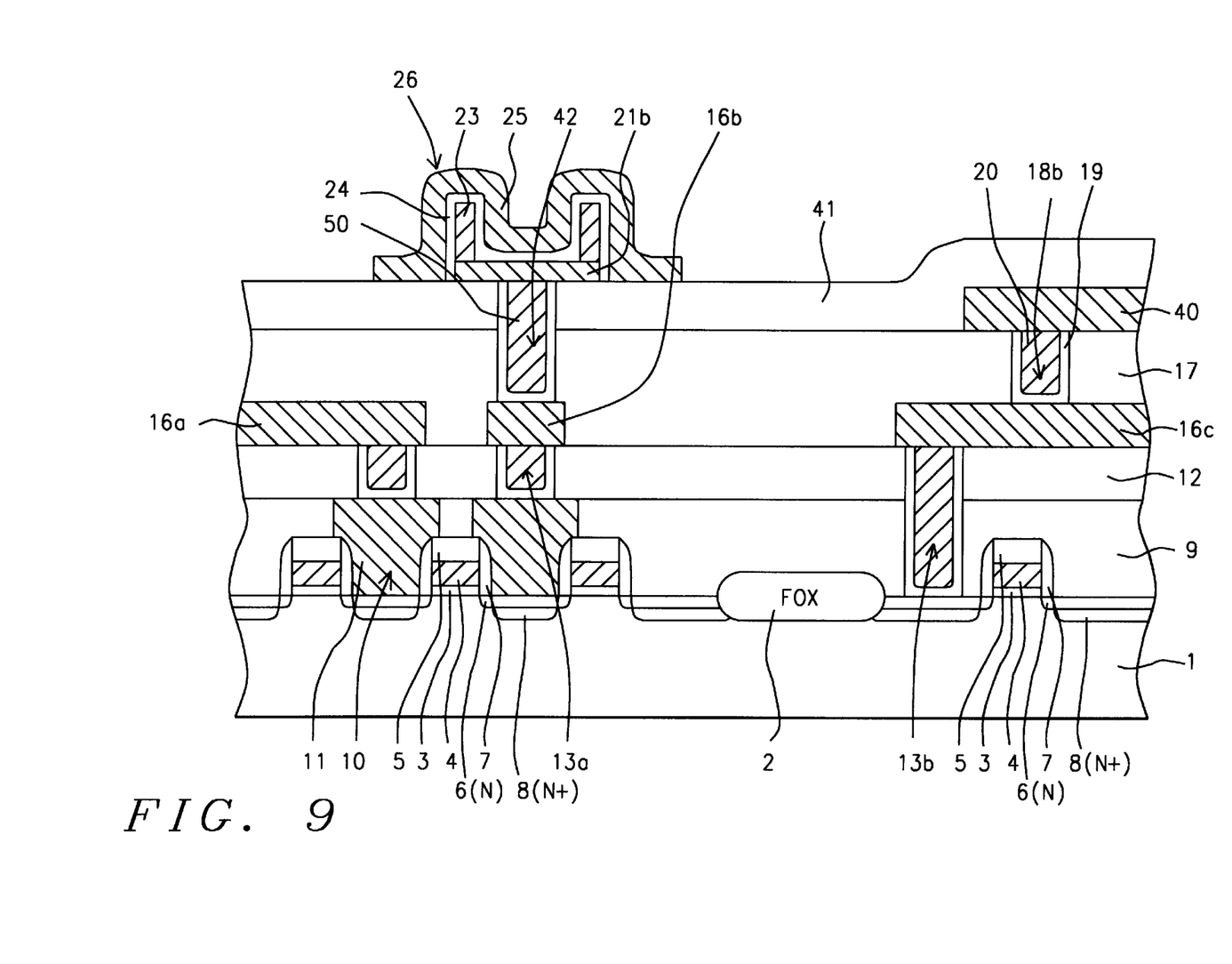

The completion of the stacked capacitor structure is schematically shown in FIG. 9. First insulator shape 22, is removed via HF vapors, or a HF wet solution. Next a dielectric layer 24, is formed, overlying the storage node structure. Dielectric layer 24, can be an insulator layer possessing a high dielectric constant, such as $Ta_2O_5$, obtained via r.f sputtering, or CVD techniques, at an equivalent silicon dioxide thickness between about 20 to 40 Angstroms. Dielectric layer 24, can also be ONO, (Oxidized—silicon Nitride—silicon Oxide). The ONO layer is formed by initially growing a silicon dioxide layer, between about an 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Dielectric layer 24, can also be a barium strontium titanate, (BST), or a lead zirconate titanate, (PZT), layer. Finally another layer of polysilicon is deposited, via LPCVD procedures, at a temperature between about 500 to 700° C., to a thickness between about 1000 to 3000 Angstroms. Doping of this polysilicon layer is accomplished via either an in situ deposition procedure, via the addition of phosphine, to a silane ambient, or via an arsenic or phosphorous ion implantation procedure, applied to an intrinsic polysilicon layer. Photolithographic and anisotropic RIE procedures, using $Cl_2$ as an etchant, are next employed to create polysilicon upper electrode, or plate electrode 25, shown schematically in FIG. 9. Photoresist is again removed via plasma oxygen ashing and careful wet cleans, resulting in stacked capacitor structure 26, laying on the smooth top surface of fourth insulator layer 41, and contacting the source and drain region, in semiconductor substrate 1, using third level metal stud 50, in via hole 42, second level metal stud, using metal plug 16b, using first level metal stud in shallow via hole 13a, and using a polysilicon contact plug 11.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, with a Capacitor Over Metal, (COM), stacked capacitor structure, comprising the steps of:

providing a first transfer gate transistor, comprised of polysilicon gate structures, on a gate insulator layer, with a first source and drain region in said semiconductor substrate, in an area not covered by said polysilicon gate structures;

providing a second source and drain region in said semiconductor substrate, for a second transfer gate transistor;

forming contact plugs, in contact holes in a first insulator layer, with the contact plugs placed between said polysilicon gate structures of said first transfer gate transistor, and with said contact plugs, contacting said first source and drain region, of said first transfer gate transistor;

forming short, first level metal studs, in shallow via holes, created in a second insulator layer, with said short, first level metal studs contacting the top surface of said contact plugs;

forming a tall, first level metal stud, in a deep via hole, created in said second insulator layer, and in said first insulator layer, with said tall, first level metal stud contacting said second source and drain region, of said second transfer gate transistor;

forming a metal bit line structure, contacting the top surface of a first, short, first level metal stud;

forming a metal plug contacting the top surface of a second, short first level metal stud;

forming a first level metal interconnect structure, contacting the top surface of said tall, first level metal stud;

forming a second level metal stud in a via hole created in a third insulator layer, with said second level metal stud contacting the top surface of said first level interconnect structure;

forming a third level metal stud in a via hole created in a fourth insulator layer, and in said third insulator layer, with said third level metal stud contacting the top surface of said metal plug; and forming said COM, stacked capacitor structure, on the top surface of said fourth insulator layer, and with said COM, stacked capacitor structure contacting the top surface of said third level metal stud.

2. The method of claim 1, wherein said gate insulator layer is silicon dioxide, thermally grown in an oxygen steam ambient, at a temperature between about 850 to 1050° C., to a thickness between about 50 to 200 Angstroms.

3. The method of claim 1, wherein said first insulator layer is silicon oxide, deposited using LPCVD or PECVD procedures, to a thickness between about 3000 to 8000 Angstroms, with the top surface of said first insulator layer planarized using a CMP procedure.

4. The method of claim 1, wherein said contact holes, formed in said first insulator layer, are formed between, and self-aligned to, said polysilicon gate structures of said first transfer gate transistor, and with said contact holes formed via a RIE procedure, using $CHF_3$ as an etchant.

5. The method of claim 1, wherein said polysilicon contact plugs are formed via deposition of a polysilicon layer, using an LPCVD procedure, to a thickness between about 500 to 3000 Angstroms, and doped during an in situ deposition procedure, or doped via an arsenic or phosphorous ion implantation procedure, and patterned by removal of unwanted regions of the polysilicon layer, on the top surface of said first insulator layer, via an anisotropic RIE procedure, using $Cl_2$ as an etchant, or by removal of unwanted regions of polysilicon using a CMP procedure.

6. The method of claim 1, wherein said second insulator layer is silicon oxide, deposited using either LPCVD or PECVD procedures, at a temperature between about 200 to 600° C., to a thickness between about 2500 to 7500 Angstroms.

7. The method of claim 1, wherein said short, first level metal studs, in said shallow via holes, and said tall, first level metal stud, in said deep via hole, are comprised of: an underlying titanium—titanium nitride layer, deposited using R.F. sputtering, to a titanium thickness between about 200 to 800 Angstroms, and to a titanium nitride thickness between about 500 to 1500 Angstroms; and comprised of a tungsten layer, deposited using R.F. sputtering or LPCVD procedures, to a thickness between about 600 to 2500 Angstroms.

8. The method of claim 1, wherein said metal bit line structure, said metal plug, and said first level metal interconnect structure, are comprised of an aluminum layer, containing between about 0 to 2% copper, at a thickness between about 1500 to 6000 Angstroms.

9. The method of claim 1, wherein said third insulator layer is silicon nitride, deposited using a PECVD procedure, at a temperature between about 200 to 600° C., to a thickness between about 3000 to 8000 Angstroms, and with the top surface of said third insulator layer planarized using a CMP procedure.

10. The method of claim 1, wherein said second level metal studs are comprised of an underlying titanium nitride layer, obtained using an R.F. sputtering procedure, to a thickness between about 500 to 1500 Angstroms, and an overlying tungsten layer, obtained using an R.F. sputtering procedure, or by using a LPCVD procedure, to a thickness between about 3000 to 8000 Angstroms.

11. The method of claim 1, wherein said fourth insulator layer is a composite insulator layer, comprised of: an overlying silicon nitride layer, deposited via PECVD procedures to a thickness between about 500 to 1500 Angstroms; and comprised of an underlying silicon oxide layer.

12. The method of claim 1, wherein said third level metal stud is comprised of an underlying titanium nitride layer, and a tungsten layer, deposited using R.F. sputtering or CVD procedures.

13. The method of claim 1, wherein the storage node structure, of said COM, stacked capacitor structure, is comprised of an N type doped, horizontal polysilicon shape, at a thickness between about 250 to 2000 Angstroms, and polysilicon spacers, connected to said horizontal polysilicon shape, at a thickness between about 250 to 3000 Angstroms, with said polysilicon spacers at a height between about 2000 to 12000 Angstroms.

14. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

15. The method of claim 1, wherein said dielectric layer is $Ta_2O_5$, obtained via r.f. sputtering techniques, to an equivalent silicon dioxide thickness between about 20 to 40 Angstroms.

16. A method of fabricating a DRAM device, using a stacked capacitor structure, (STC), on a semiconductor substrate, created after the formation of underlying metal structures, and with the Capacitor Over Metal, (COM), stacked capacitor structure, formed on a insulator layer, comprising the steps of:

providing a first transfer gate transistor, on said semiconductor substrate, comprised of polysilicon gate structures on a silicon dioxide gate insulator layer, and with a first source and drain region, in said semiconductor substrate, between said polysilicon gate structures;

providing a second source and drain region in said semiconductor substrate, for a second transfer gate transistor;

depositing a first insulator layer;

planarizing said first insulator layer;

forming self-aligned contact openings, in said first insulator layer, to expose said first source and drain region;

depositing a first polysilicon layer, completely filling said self-aligned contact holes;

removing said first polysilicon layer from the top surface of said first insulator layer, resulting in the formation of polysilicon contact plugs, in said self-aligned contact holes;

depositing a second insulator layer;

opening shallow via holes in said second insulator layer, exposing the top surface of said polysilicon contact plugs;

opening a deep via hole in said second insulator layer, and in said first insulator layer, exposing the top surface of said second source and drain region;

depositing a first titanium nitride layer;

depositing a first tungsten layer, completely filling said shallow via holes, and completely filling said deep via hole;

removing said first tungsten layer, and said first titanium nitride layer, from the top surface of said second insulator layer, resulting in short, first level tungsten studs, in said shallow via holes, and resulting in a tall, first level tungsten stud, in said deep via hole;

depositing an aluminum based layer;

patterning of said aluminum based layer to form an aluminum based, bit line structure, contacting the top surface of a first, short, first level tungsten stud;

patterning of said aluminum based layer to form an aluminum based, metal plug, contacting the top surface of a second, short, first level tungsten stud;

patterning of said aluminum based layer to form an aluminum based, first level interconnect structure, contacting the top surface of said tall, first level tungsten stud;

depositing a third insulator layer;

planarizing said third insulator layer;

opening a via hole in said third insulator layer, exposing the top surface of said aluminum based, first level interconnect structure;

depositing a second titanium nitride layer;

depositing a second tungsten layer, completely filling via hole in said third insulator layer;

removing said second tungsten layer, and said second titanium nitride layer, from the top surface of said third insulator layer, creating a second level tungsten stud, in the via hole in said third insulator layer, contacting the top surface of said aluminum based, first level interconnect structure;

depositing a fourth insulator layer;

opening a via hole in said fourth insulator layer, and in said third insulator layer, exposing the top surface of said aluminum based metal plug;

depositing a third titanium nitride layer;

depositing a third tungsten layer;

removing said third tungsten layer, and said third titanium nitride layer, from the top surface of said fourth insulator layer, creating a third level tungsten stud, in the via hole in said fourth insulator layer, and in said third insulator layer, contacting the top. surface of said aluminum based metal plug;

depositing a second polysilicon layer;

depositing a fifth insulator layer;

patterning of said fifth insulator layer, to create an insulator shape on said second polysilicon layer;

depositing a third polysilicon layer;

anisotropic etching of said third polysilicon layer, to create polysilicon spacers on the sides of said insulator shape;

removing said second polysilicon layer, from the top surface of said fourth insulator layer, in a region in which said second polysilicon layer is not covered by said insulator shape, creating a horizontal polysilicon shape, underlying said insulator shape;

removing said insulator shape from the top surface of said horizontal polysilicon shape, creating a polysilicon storage node structure, for said COM, stacked capacitor structure, comprised of vertical, said polysilicon spacers, connected to said horizontal polysilicon shape;

forming a dielectric layer on said storage node structure, of said COM, stacked capacitor structure;

depositing a fourth polysilicon layer on said dielectric layer; and patterning of said fourth polysilicon layer to form the plate electrode, of said COM, stacked capacitor structure.

17. The method of claim 16, wherein said first insulator layer is silicon oxide obtained via LPCVD procedures, to a thickness between about 3000 to 8000 Angstroms.

18. The method of claim 16, wherein said first polysilicon layer, used for said polysilicon contact plugs, is deposited using LPCVD procedures, to a thickness between about 500 to 3000 Angstroms, and doped in situ during deposition, or deposited intrinsically and doped via an arsenic or phosphorous ion implantation procedure.

19. The method of claim 16, wherein said second insulator layer is silicon oxide, deposited using LPCVD or PECVD procedures, to a thickness between about 2500 to 7500 Angstroms.

20. The method of claim 16, wherein said first titanium nitride layer is deposited using R.F. sputtering, to a thickness between about 500 to 1500 Angstroms.

21. The method of claim 16, wherein said first tungsten layer is deposited using LPCVD procedures, or R.F sputtering procedures, to a thickness between about 600 to 2500 Angstroms.

22. The method of claim 16, wherein said aluminum based layer, contains between about 0 to 2% copper, and is deposited using R.F. sputtering, to a thickness between about 1500 to 6000 Angstroms.

23. The method of claim 16, wherein said third insulator layer is silicon oxide, deposited using PECVD procedures, to a thickness between about 3000 to 8000 Angstroms, and planarized using a CMP procedure.

24. The method of claim 16, wherein said second titanium nitride layer is deposited using R.F. sputtering, to a thickness between about 500 to 1500 Angstroms.

25. The method of claim 16, wherein said second tungsten layer is deposited using an LPCVD procedure, or R.F. sputtering, to a thickness between about 3000 to 8000 Angstroms.

26. The method of claim 16, wherein said second polysilicon layer is deposited using LPCVD procedures, to a thickness between about 250 to 2000 Angstroms, and doped during an in situ deposition procedure, or via an arsenic or phosphorous ion implantation procedure.

27. The method of claim 16, wherein said third polysilicon layer is deposited using LPCVD procedures, to a thickness between about 250 to 3000 Angstroms.

28. The method of claim 16, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

29. The method of claim 16, wherein said thin dielectric layer is $Ta_2O_5$, deposited using r.f. sputtering procedures, to an equivalent silicon dioxide thickness between about 20 to 40 Angstroms.

* * * * *